(12) United States Patent
LoCasale et al.

(10) Patent No.: US 6,686,857 B2
(45) Date of Patent: Feb. 3, 2004

(54) INFORMATION DEPENDENT DATA TRANSMISSION FOR PILOT PROTECTIVE RELAYS

(75) Inventors: Thomas M. LoCasale, Doylestown, PA (US); Joel A. B. Elston, Easton, PA (US); Ismail I. Jouny, Easton, PA (US)

(73) Assignee: ABB Inc., Norwalk, CT (US)

( * ) Notice: Subject to any disclaimer, the term of this patent is extended or adjusted under 35 U.S.C. 154(b) by 0 days.

(21) Appl. No.: 10/099,209

(22) Filed: Mar. 14, 2002

(65) Prior Publication Data

US 2003/0174074 A1 Sep. 18, 2003

(51) Int. Cl.[7] ............................................. H03M 1/00
(52) U.S. Cl. ........................... 341/110; 341/64; 341/66
(58) Field of Search ................................ 341/110, 107, 341/66; 361/64; 370/216; 342/90; 382/166; 704/230

(56) References Cited

U.S. PATENT DOCUMENTS

| | | | |
|---|---|---|---|
| 4,538,196 A | * | 8/1985 | Sun et al. ...................... 361/64 |
| 5,267,231 A | * | 11/1993 | Dzieduszko ................. 370/216 |
| 5,666,060 A | * | 9/1997 | Sukegawa et al. .......... 324/617 |
| 5,990,823 A | * | 11/1999 | Peele et al. ................... 342/90 |
| 6,075,470 A | * | 6/2000 | Little et al. .................. 341/107 |
| 6,125,201 A | * | 9/2000 | Zador .......................... 382/166 |
| 6,493,666 B2 | * | 12/2002 | Wiese, Jr. .................... 704/230 |

FOREIGN PATENT DOCUMENTS

EP          0315983          *  5/1989

OTHER PUBLICATIONS

Whitehead et al. (US application No. 09/895,479) "Apparatus and method for compression of data in protection and control communcations between relays in a power system" filed on Jun. 29, 2001.*

* cited by examiner

*Primary Examiner*—Jean Jeanglaude
(74) *Attorney, Agent, or Firm*—Michael M. Rickin

(57) ABSTRACT

Waveform information is transmitted from the ends of a protection zone by first compressing the information using a lossy compression technique such as wavelets and then compressing the lossy compressed waveform information using a loss-less compression technique such as the Burrows-Wheeler transform. Status information is transmitted from the ends of the protection zone by compressing that information using the loss-less technique. The time for transmission can be less than, equal to or greater than the time for one cycle of the power line frequency.

24 Claims, 25 Drawing Sheets

(24 of 25 Drawing Sheet(s) Filed in Color)

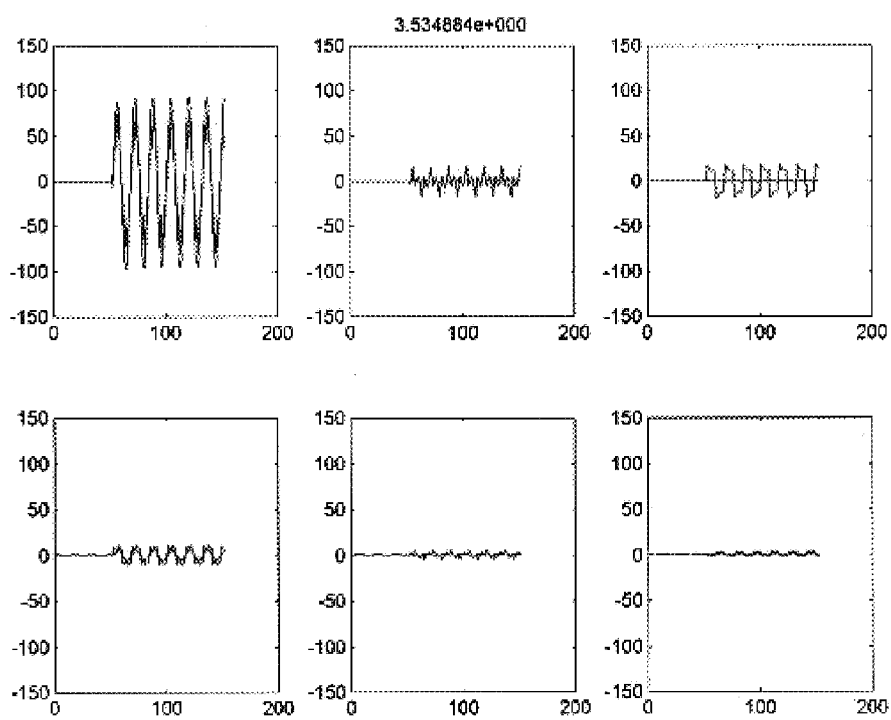
Figure 2 Variable strength channels, wavelet compression on real data stacked using format A.

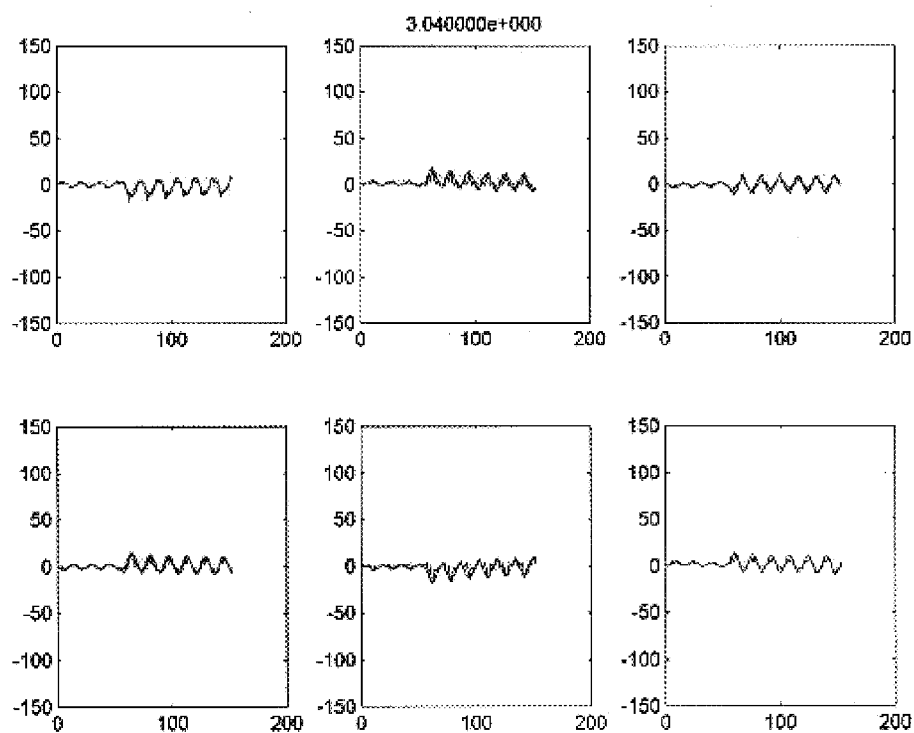
Figure 3  Consistent strength channels, wavelet compression on real data, format A stacking.

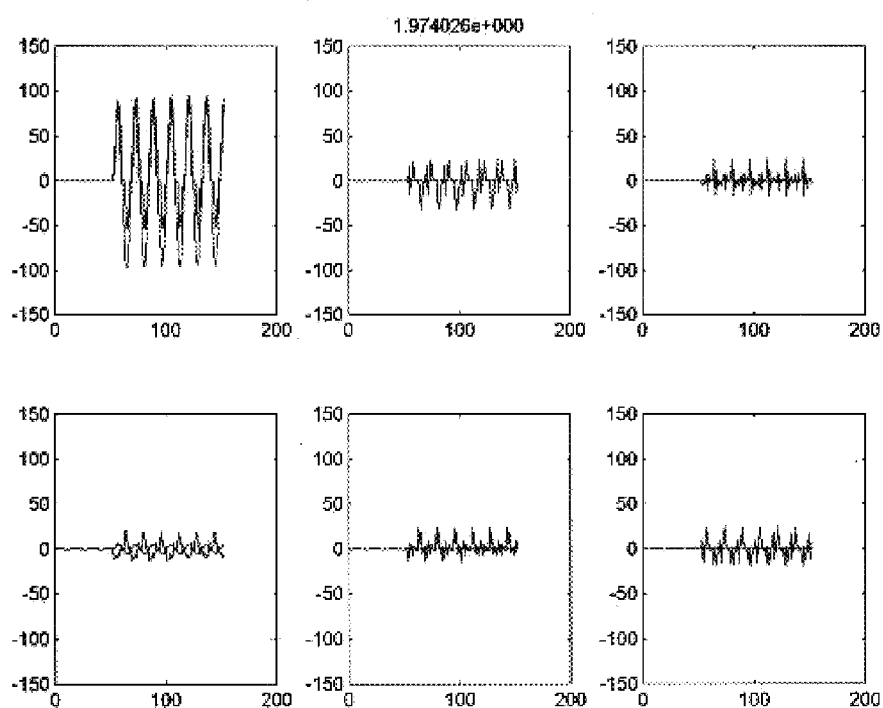
Figure 4 Variable strength channels, wavelet compression on real data, stacked using format B.

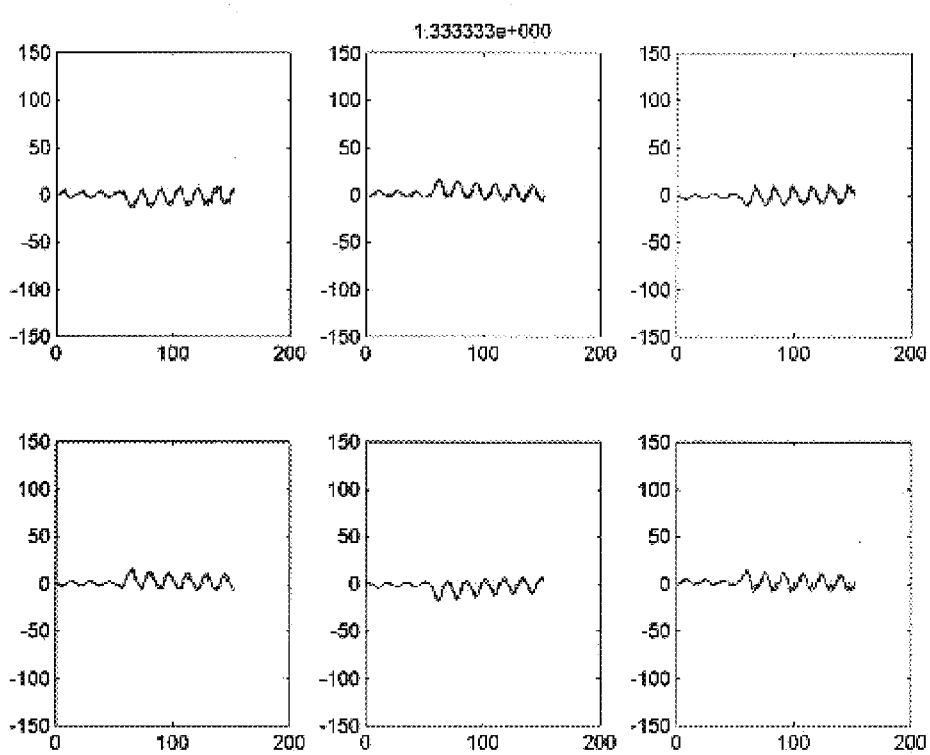
Figure 5 Consistent strength channels, wavelet compression on real data, format B stacking.

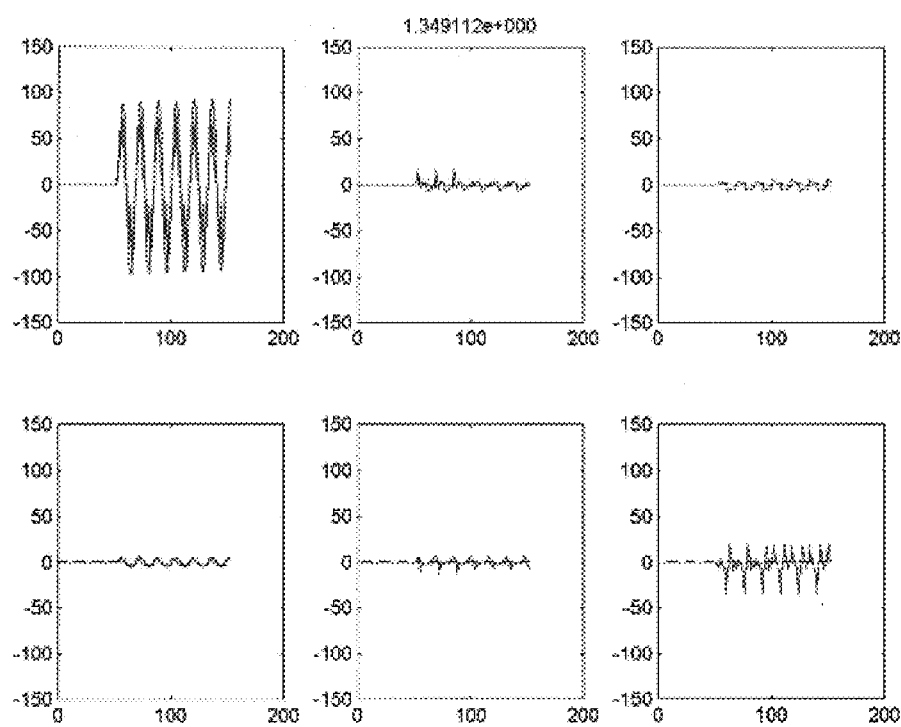
Figure 6 Variable strength channels, wavelet compression on DFTed data, real and imaginary compressed separately, format A stacking.

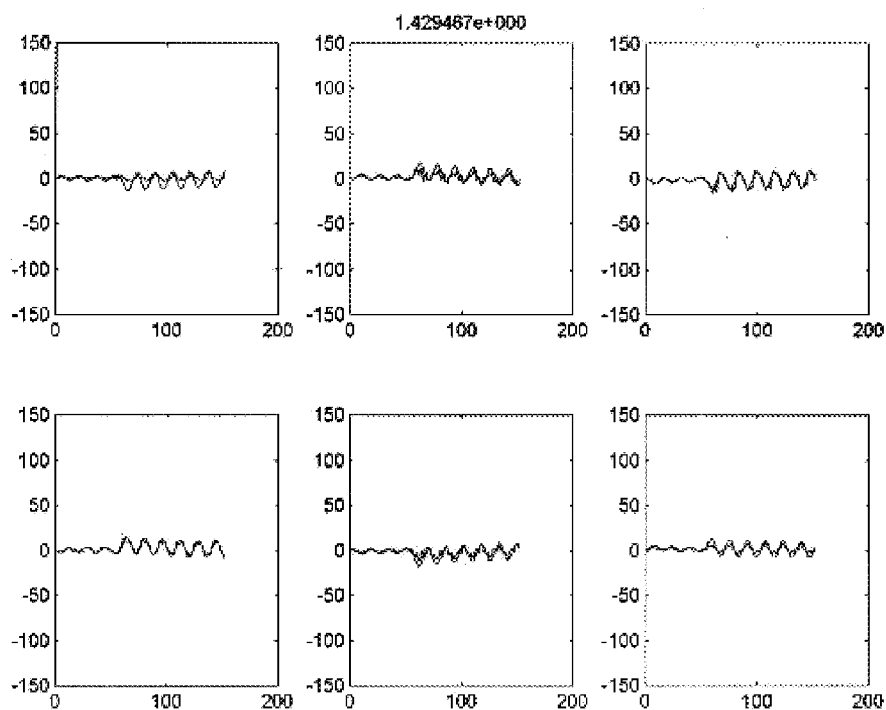
Figure 7 Consistent strength channels, wavelet compression on DFTed data, real and imaginary compressed separately, format A stacking.

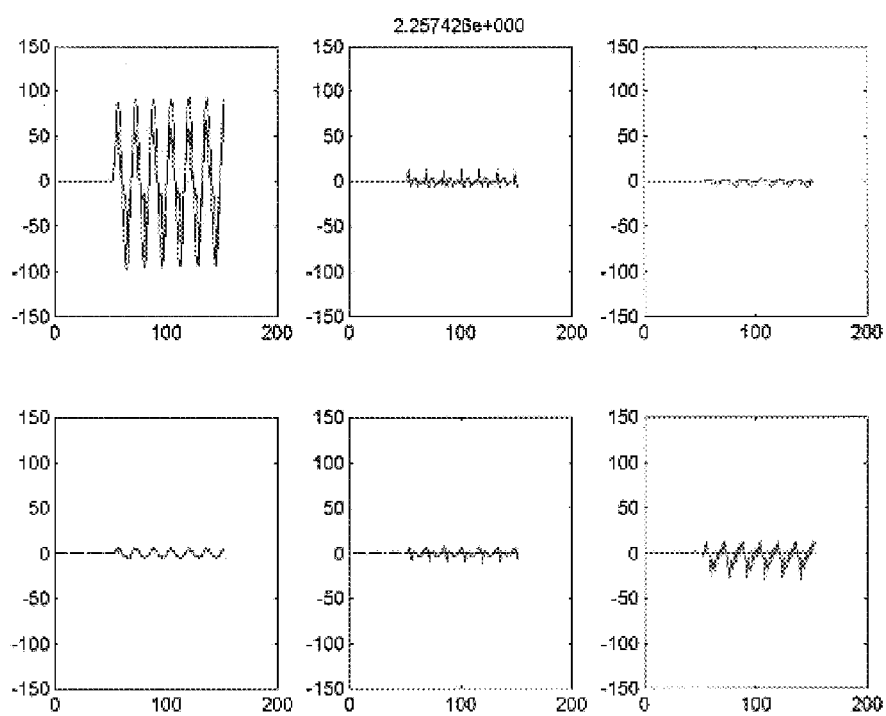
Figure 8 Variable strength channels, wavelet compression on DFTed data, real and imaginary compressed together, format A stacking.

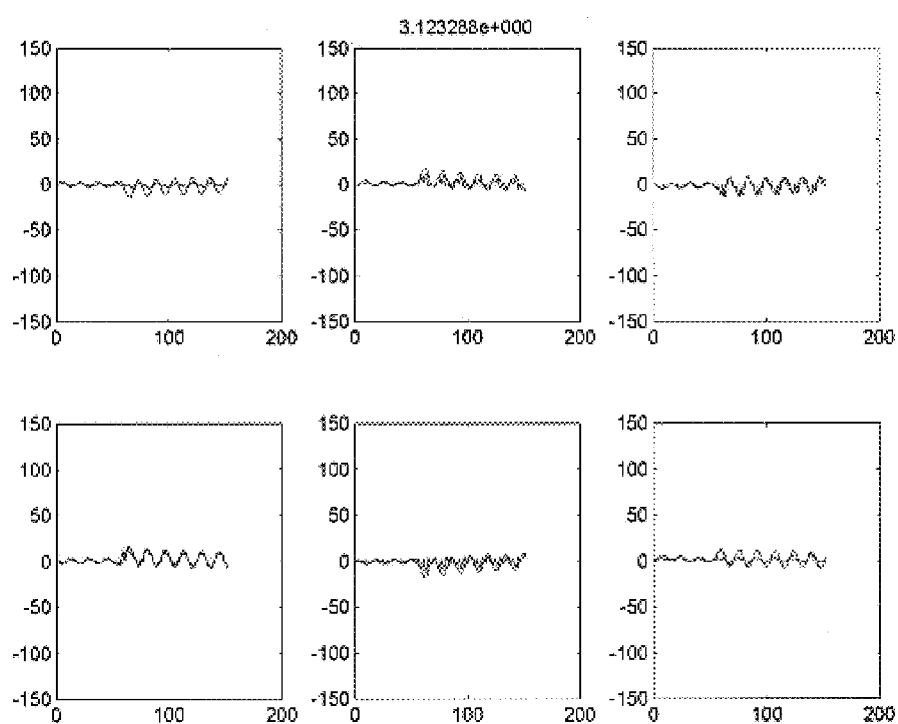
Figure 9 Consistent strength channels, wavelet compression on DFTed data, real and imaginary compressed together, format A stacking.

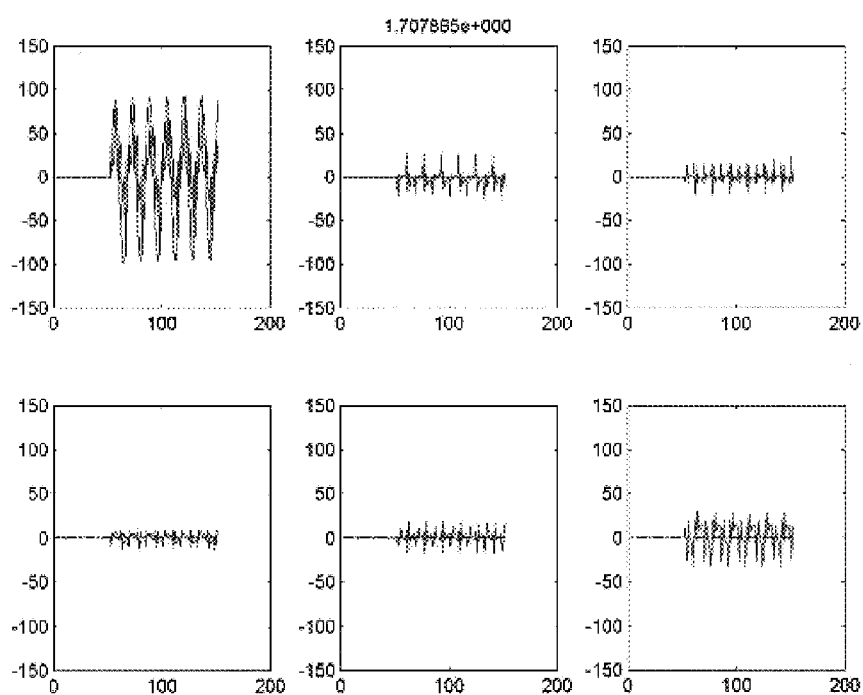
Figure 10 Variable strength channels, wavelet compression on DFTed data, magnitude and phase compressed separately, format A stacking.

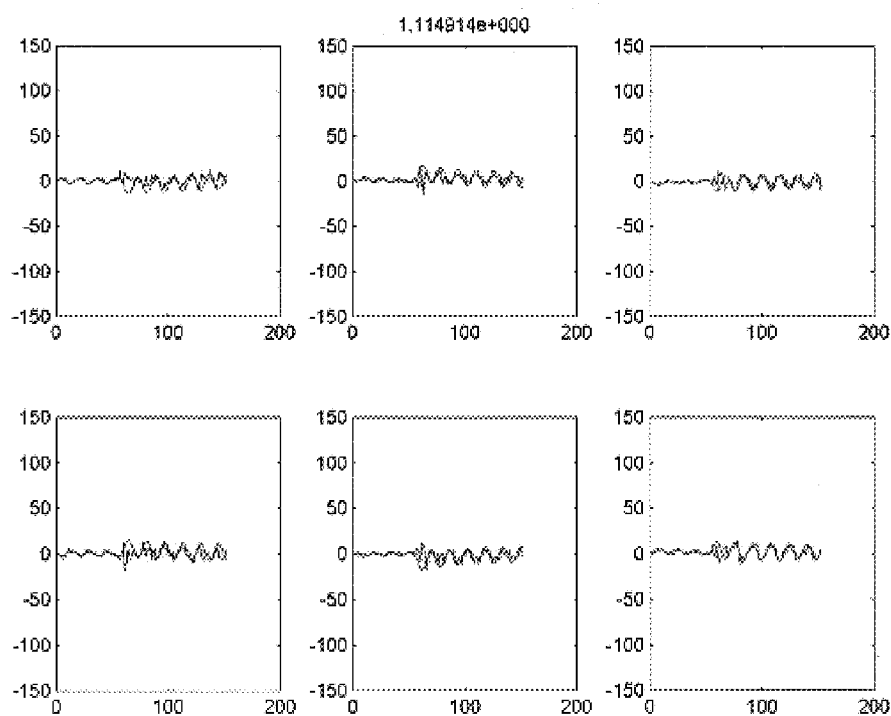
Figure 11 Consistent strength channels, wavelet compression on DFTed data, magnitude and phase compressed separately, format A stacking.

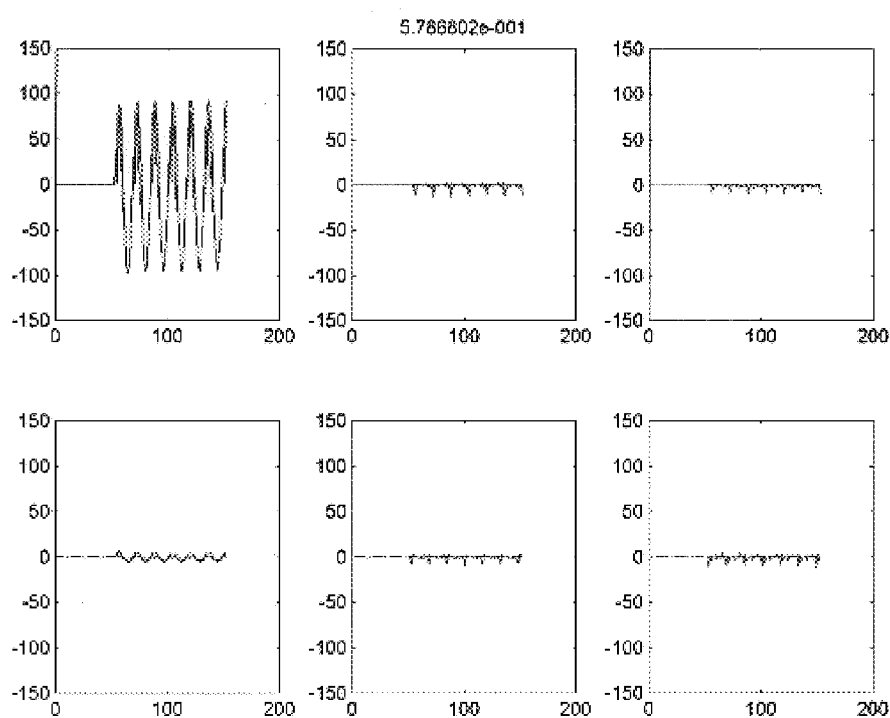
Figure 12 Variable strength channels, wavelet compression on DFTed data, real and imaginary compressed separately, format B stacking.

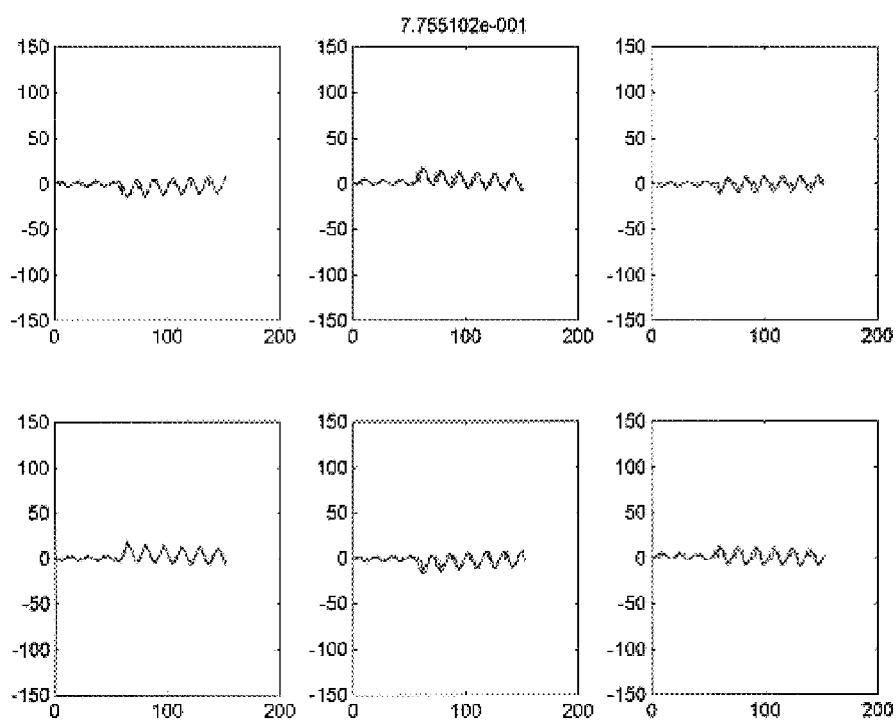
Figure 13 Consistent strength channels, wavelet compression on DFTed data, real and imaginary compressed separately, format B stacking.

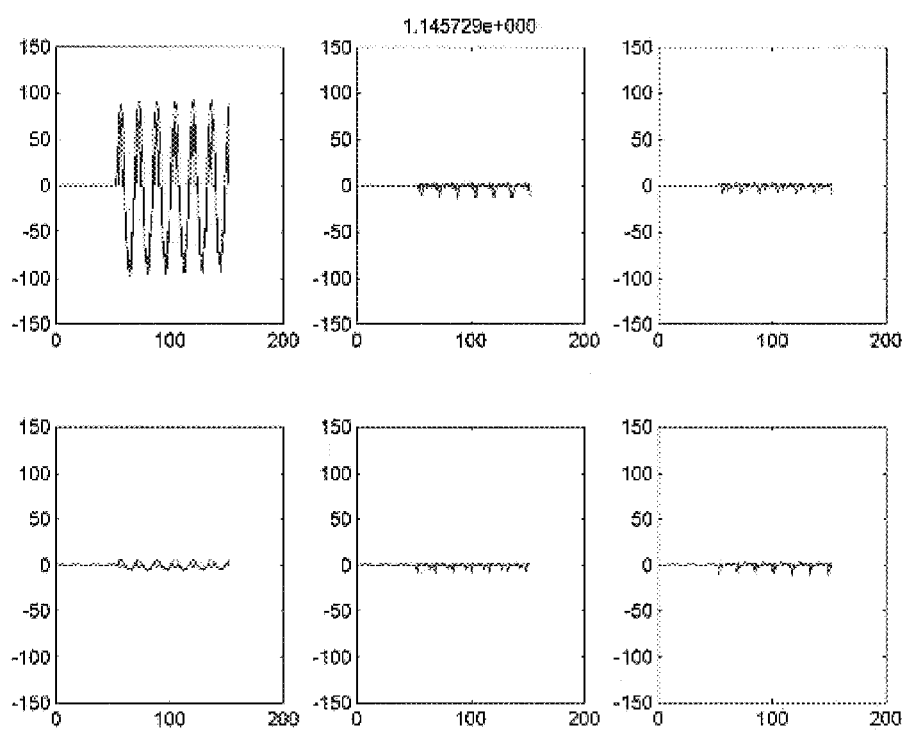
Figure 14 Variable strength channels, wavelet compression on DFTed data, real and imaginary compressed together, format B stacking.

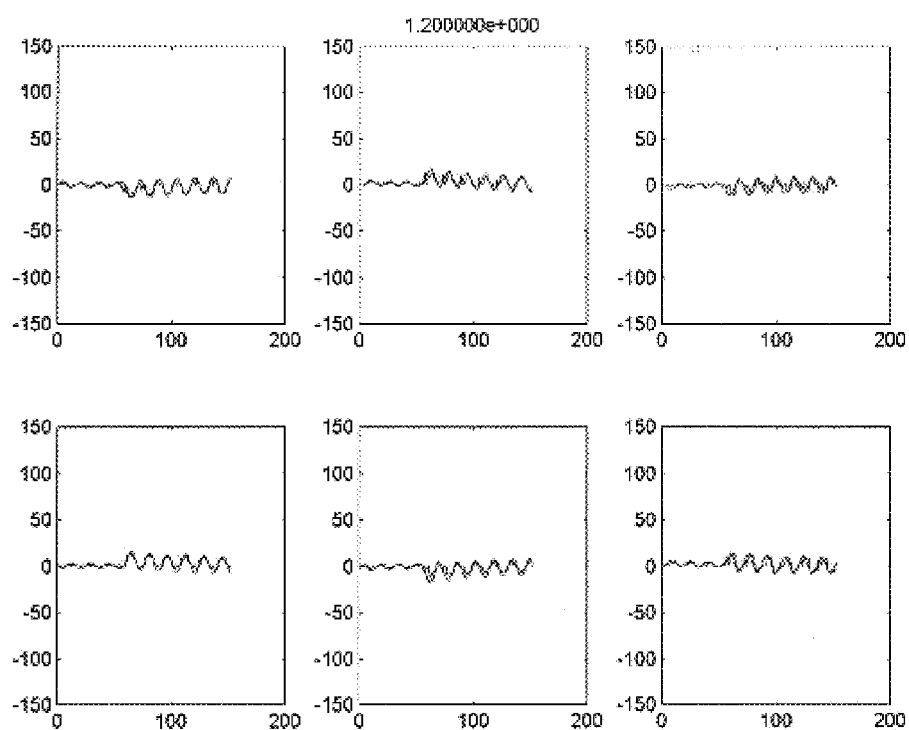
Figure 15 Consistent strength channels, wavelet compression on DFTed data, real and imaginary compressed together, format B stacking.

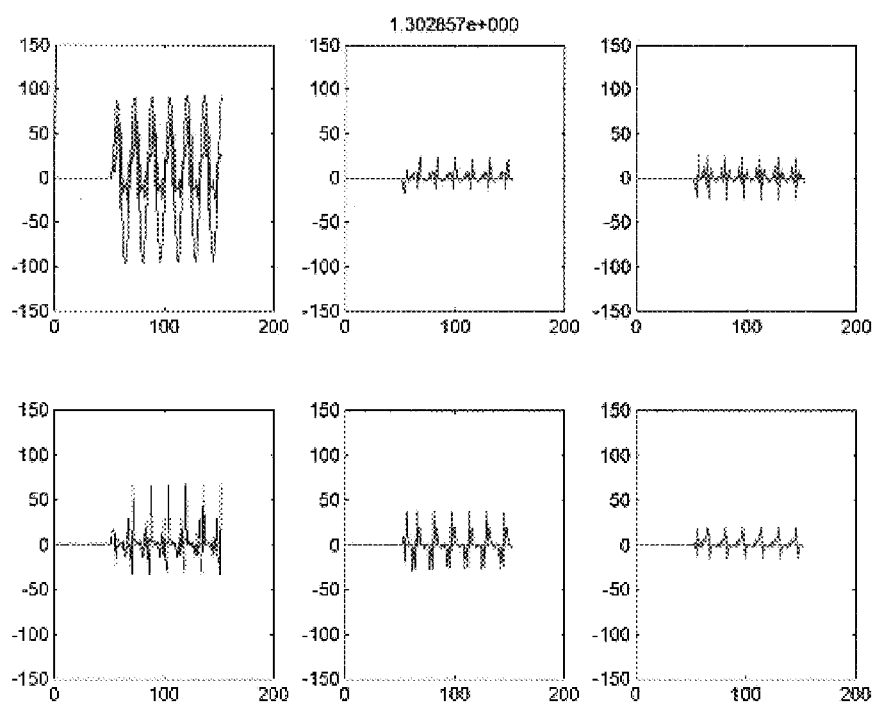
Figure 16 Consistent strength channels, wavelet compression on DFTed data, magnitude and phase compressed separately, format B stacking.

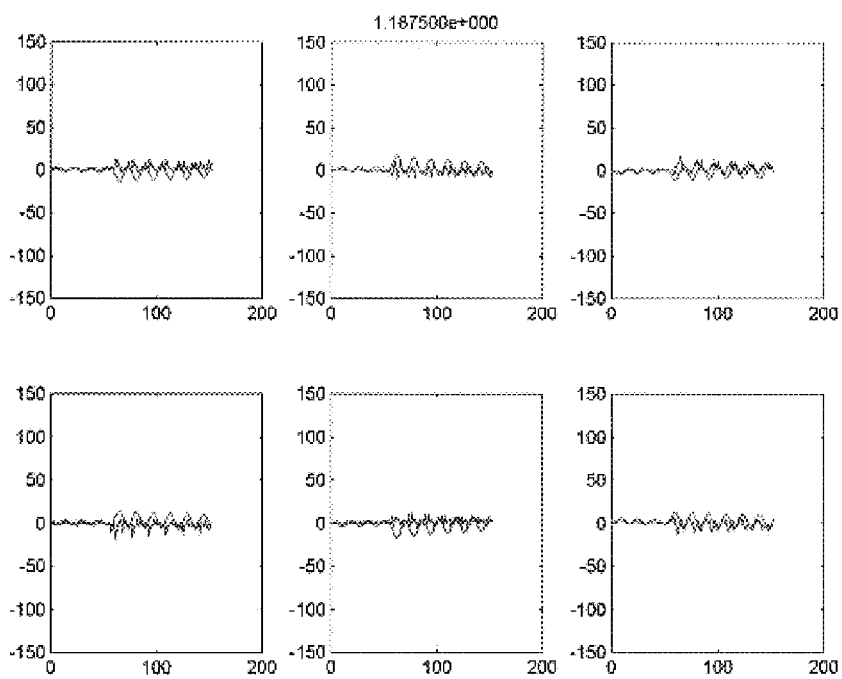
Figure 17 Consistent strength channels, wavelet compression on DFTed data, magnitude and phase compressed separately, format B stacking.

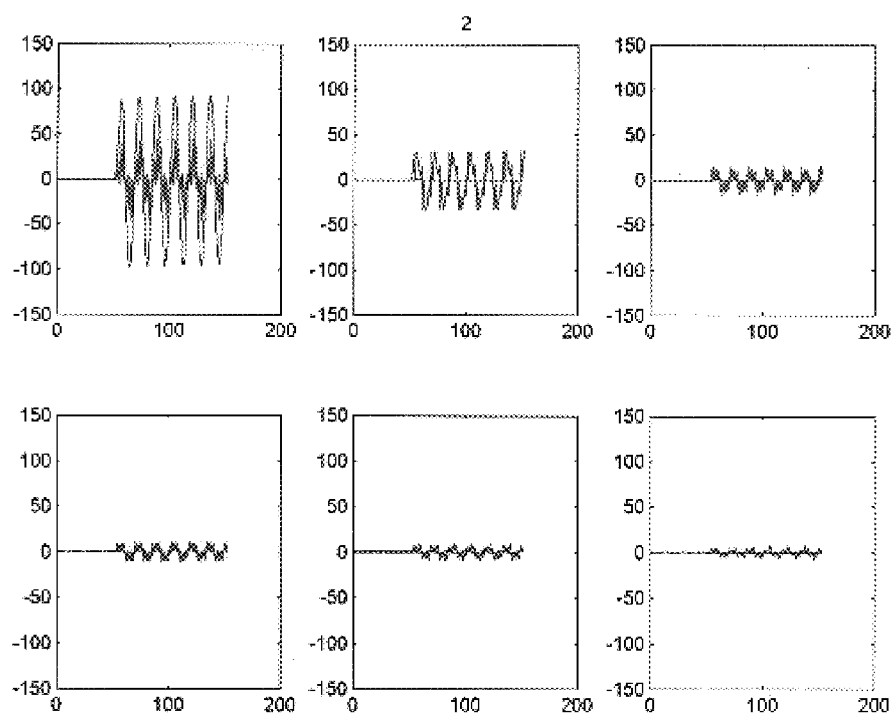
Figure 18 Variable strength channels, data DFTed, decimated in frequency, format A stacking.

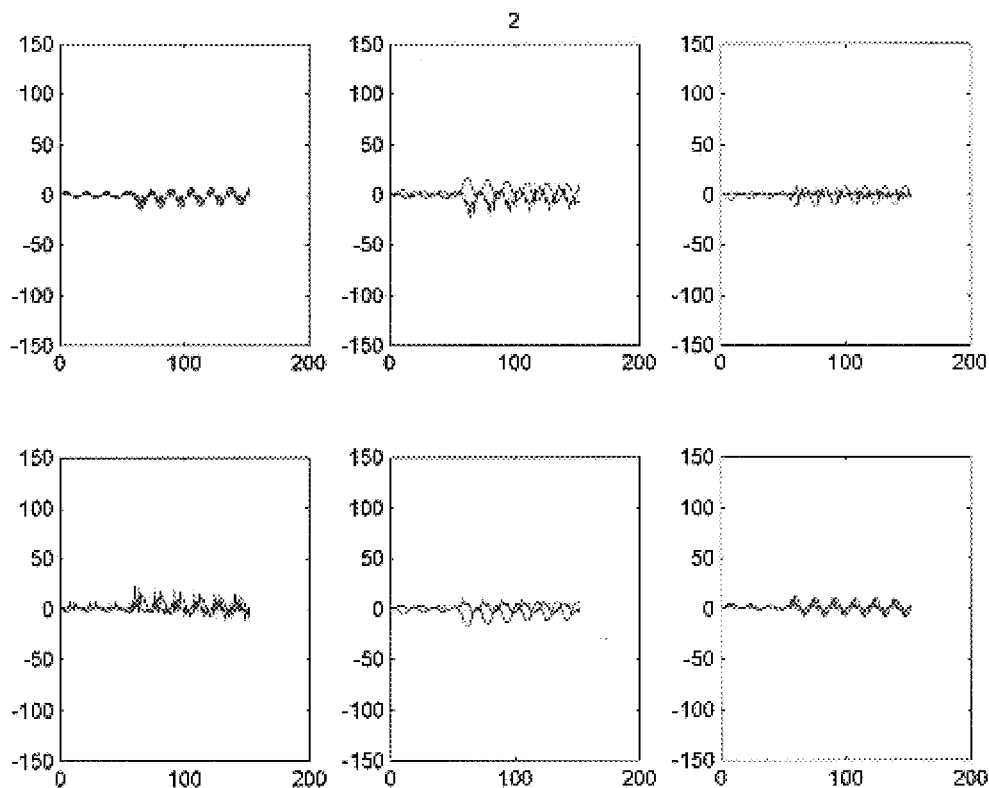
Figure 19 Consistent strength channels, data DFTed then decimated in frequency, format A stacking.

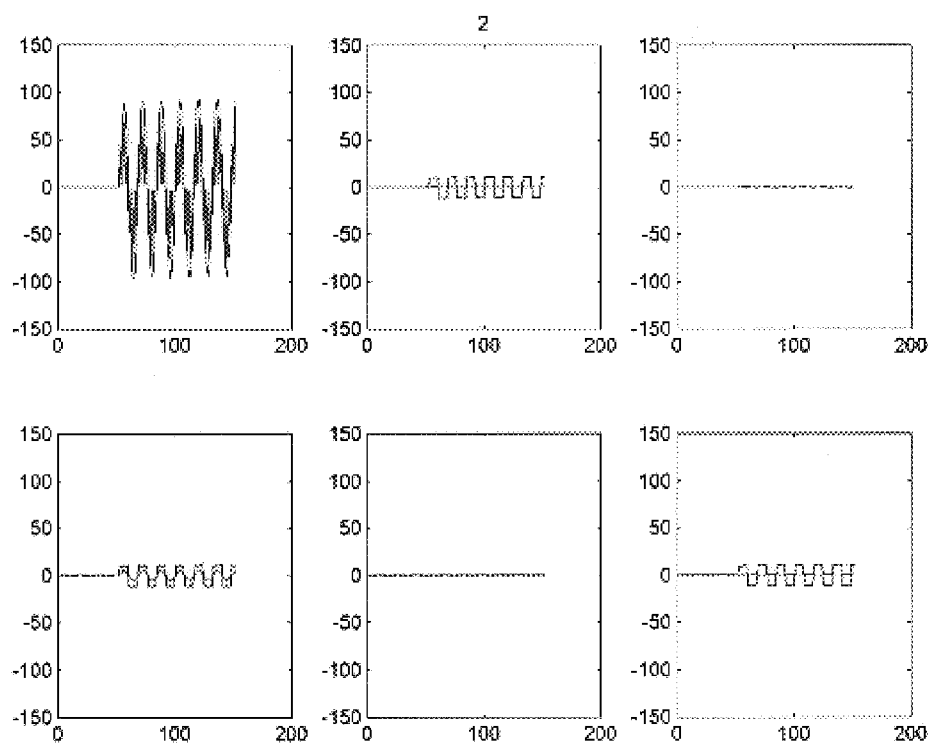
Figure 20 Variable strength channels, data DFTed, filtered in frequency, format B stacking.

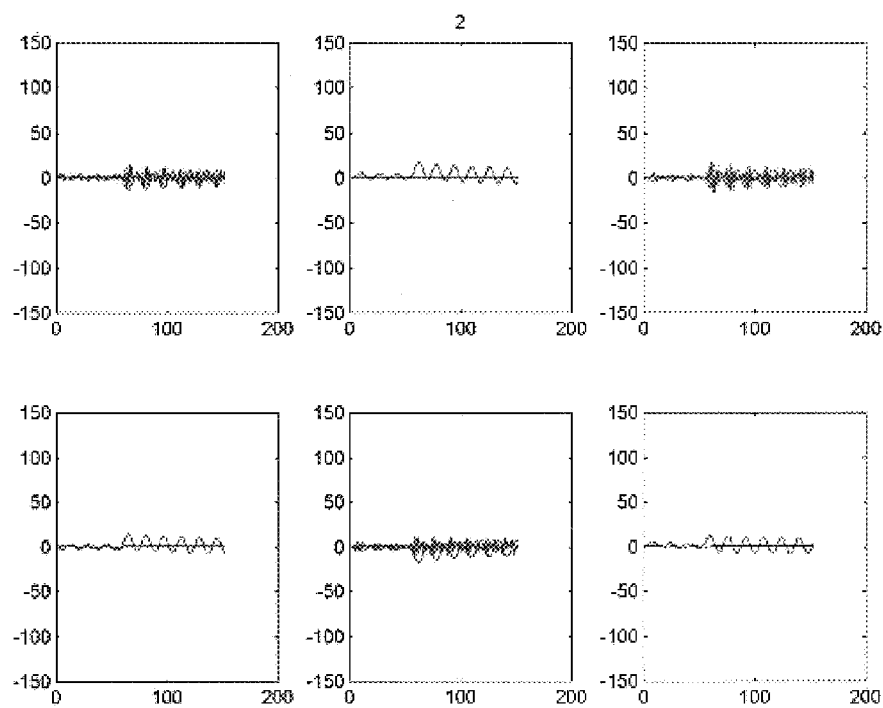
Figure 21 Consistent strength channels, data DFTed then filtered in frequency, format B stacking.

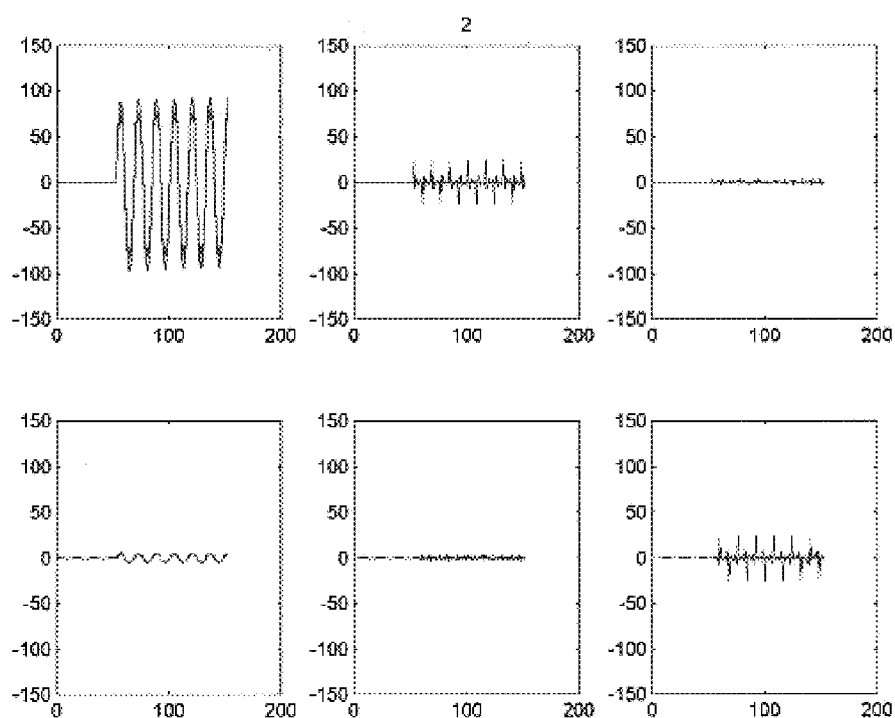
Figure 22 Variable strength channels, data DFTed, decimated in frequency, format A stacking.

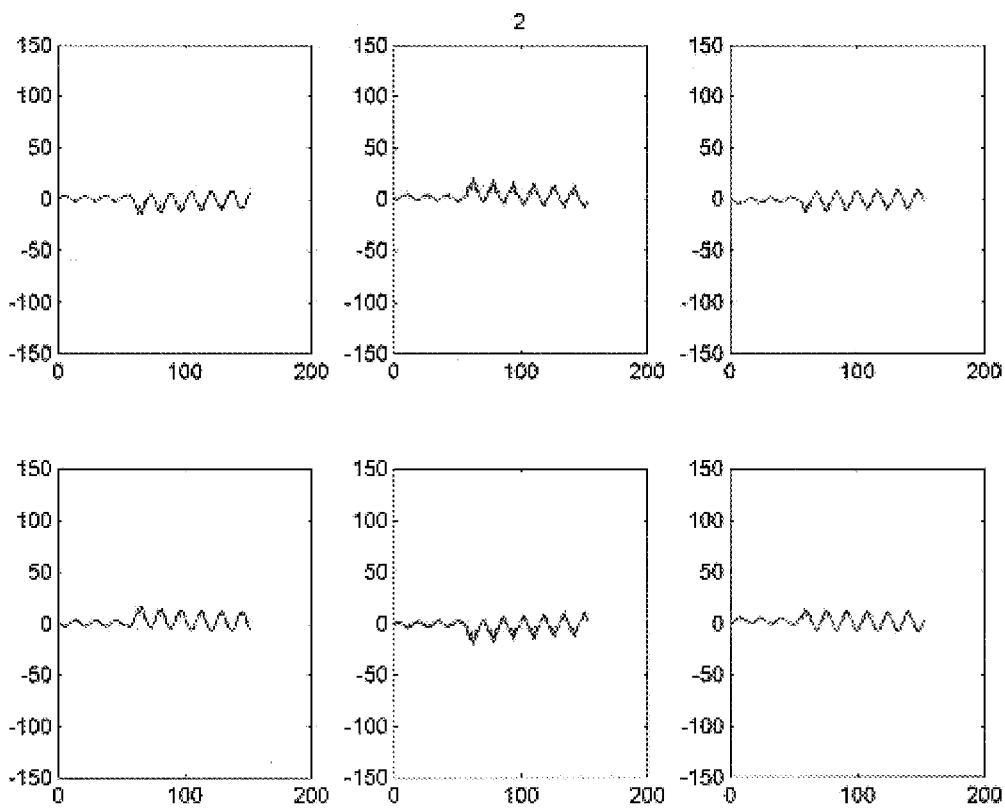
Figure 23 Consistent strength channels, data DFTed then decimated in frequency, format A stacking.

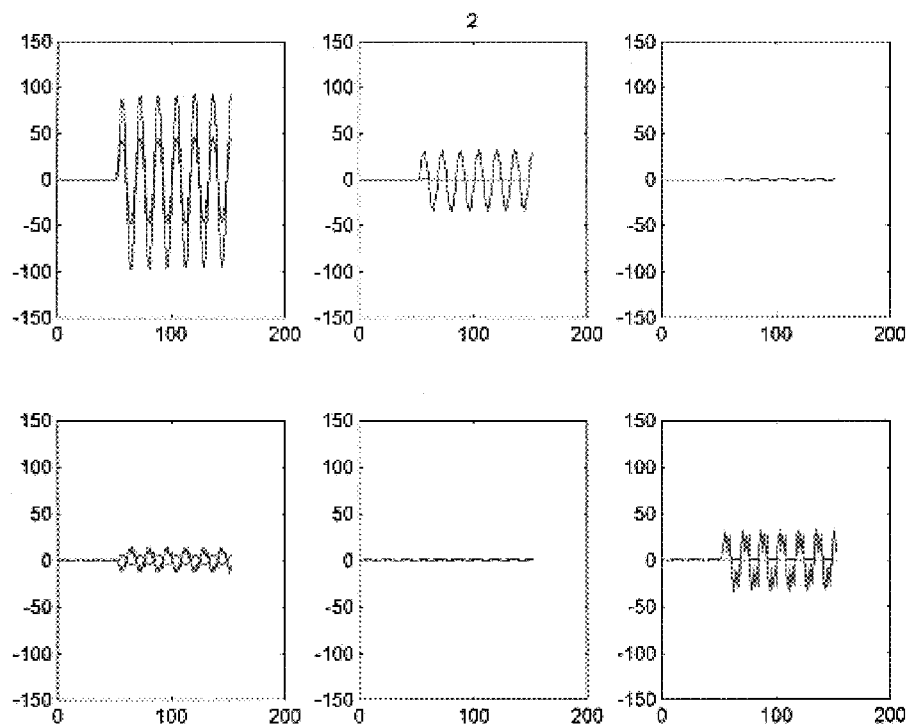
Figure 24 Variable strength channels, data DFTed, filtered in frequency, format B stacking.

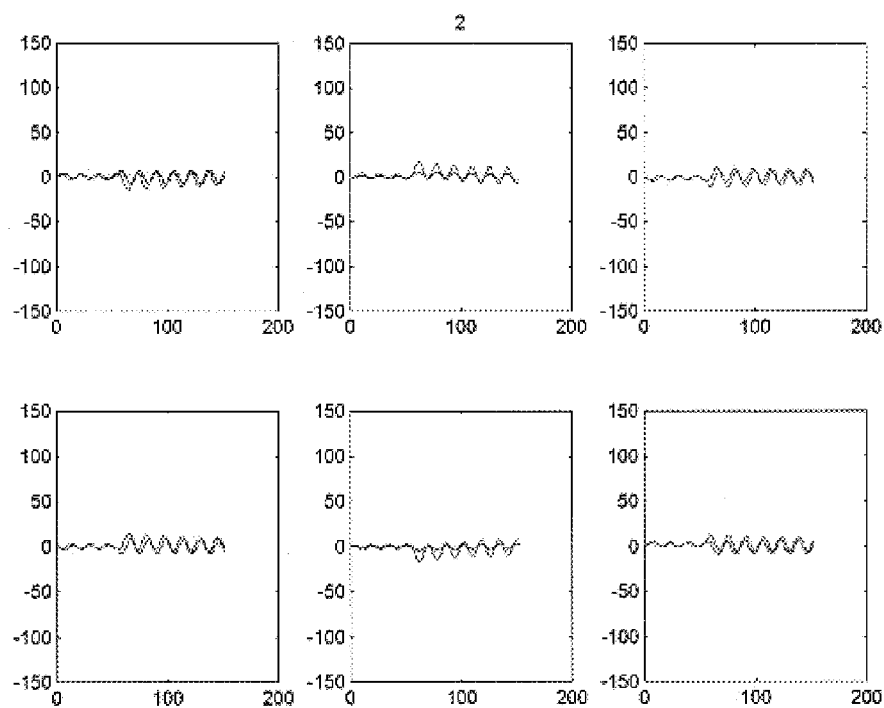
Figure 25 Consistent strength channels, data DFTed then filtered in frequency, format B stacking.

INFORMATION DEPENDENT DATA TRANSMISSION FOR PILOT PROTECTIVE RELAYS

FIELD OF THE INVENTION

This invention relates to pilot protective relays and more particularly to the communication of status and waveform information from two ends of a protection zone.

DESCRIPTION OF THE PRIOR ART

As is well known pilot protective relays are used to provide protection for high-voltage electrical transmission lines. Those sections of the transmission lines that have pilot protective relays located at each end are known as the protection zones. It is the function of the pilot relays to identify faults in the protection zone and initiate line isolation by way of the tripping of the appropriate circuit breakers. To provide this protection the pilot protective relays monitor the AC voltages and currents at the transmission line terminals and coordinate operation by communicating status and waveform information from the two ends of a protection zone. Generally, such differential protection performance improves as the amount of information increases.

As used herein waveform information refers to the analog information about the currents and voltages at the transmission line terminals and any digital representation of that analog information, and status information refers to information which is other than waveform information and is always in digital form. Status information is usually a single bit or a very small number of bits for each such item of information. As is well known voltage and current sensors, each known as a channel, are used to gather the analog waveform information. Each sensor includes an analog to digital converter which converts the analog current or voltage waveform information to a digital signal with a multiple number of bits.

The communication distances between the two ends of a protection zone may be many kilometers. The prior art has employed a variety of schemes with pilot protective relays to communicate the status and waveform information from the two ends of the protection zone. These schemes include wireline with simple on-off keying audio tone modems, wireless and fiber optic techniques.

The demands of the protective relays require that the status and waveform information be delivered in a timely fashion since the protective function should be able to make trip decisions in a time period that is less than one cycle of the power line frequency. Thus the trip decisions must be made in less than 16 milliseconds if the power line frequency is 60 Hz and in less than 20 milliseconds if the power line frequency is 50 Hz.

Present day communication of the status and waveform information from two ends of a protection zone by using techniques such as wireline in the form of, for example, plain old telephone service, currently utilize 9600 baud modems with ½ cycle or less latency. Using more sophisticated protocols such as V.90 is not feasible because of delays associated with such modems. The delays give rise to a delivery time that cannot be guaranteed and which is not acceptable if trip decisions are to be made in a time period that is less than one cycle of the power line frequency. Thus, common practice dictates jumping to fiber optic channels with 56 KB bandwidth to accommodate desired information transfer with minimum latency and variability of delivery as the use of such channels allows for trip decisions to be made in a time period that is less than one cycle of the power line frequency.

The techniques presently in use in wireline modem communication at 9600 baud rely on "Compromised" not "Compressed" data. For instance, a single weighted assembly of a symmetrical component computation is transmitted instead of the individual components. A phasor is sent as only one component (Real or Imaginary) and the other is deduced using the same waveform delayed ¼ cycle (a close approximation). As few as four samples per cycle are transmitted due to bandwidth limitations, whereas the actual waveform sample rate is considerably more than four samples per cycle. These are just a few of the lossy "compromises" in data transmission accommodating the method and media chosen for the communication link.

It is possible to increase the information data rate for the same signaling baud rate by utilizing known characteristics of the data to be transmitted. This leads to "Information Dependent Transmission". Signals are relatively stationary in normal operation and a simple expedient of sending the "difference from the norm" may increase the information throughput for the same signaling bandwidth. The signals are, however, not relatively stationary in abnormal operation and the simple expedient of sending the "difference from the norm" will not increase the information throughput for the same signaling bandwidth. Thus it is desirable to have a high capacity pilot protective relay to pilot protective relay data transmission scheme using wireline modem communications not only at 9600 baud but also at other transmission rates. It is further desirable to have such a scheme which uses information dependent data transmission. It is also further desirable to have such a scheme that improves information throughput independent of the transmission technique.

In addition, the high capacity data exchange scheme should be useable by those electric utilities that follow the well known IEEE Standard Common Format for Transient Data Exchange (COMTRADE) for power systems in keeping records of fault data for post-fault analysis such as determining the nature and location of the fault. Further details about the COMTRADE standard can be found in the "IEEE Standard Common Format for Transient Data Exchange (COMTRADE) for Power Systems," IEEE C37.111–1991, IEEE Standards Board, Approved June 1991.

SUMMARY OF THE INVENTION

The present invention is a method for an electrical transmission system. The system has at least one pilot protective relay at a first location and at least one pilot protective relay at a second location separated from the first location. The method is for transmitting waveform information from the first location to the second location and from the second location to the first location. The method comprises has the steps of:

a) compressing the waveform information at the first and the second locations using a lossy compression technique; and b) compressing the lossy compressed waveform information at the first and second locations using a loss-less compression technique.

The present invention is also a method for an electrical transmission system. The system has at least one pilot protective relay at a first location and at least one pilot protective relay at a second location separated from the first location. Each of the at least one pilot protective relays having waveform information associated therewith. The method is:

a) compressing the associated waveform information at the at least one pilot protective relay at the first location and at the at least one pilot protective relay at the second location; and b) transmitting the compressed associated waveform information from the at least one pilot protective relay at the first location to the at least one pilot protective relay at the second location and from the at least one pilot protective relay at the second location to the at least one pilot protective relay at the first location.

The invention is further an electrical transmission system. The system has a pilot protective relay at a first location on the system and a pilot protective relay at a second location on the system. The pilot protective relay at the first location transmitting waveform information from the first location to the second location and the pilot protective relay at the second location transmitting waveform information from the second location to the first location. The system also has means for lossy compressing the waveform information at the first and second location; and means for loss-less compressing the lossy compressed waveform information at the first and second locations.

DESCRIPTION OF THE DRAWING

The patent or application file contains at least one drawing executed in color. Copies of this patent or patent application publication with color drawing(s) will be provided by the Office upon request and payment of the necessary fee.

FIGS. 2–25 show in color the results of the investigation of wavelet based compression of real current power system data.

DESCRIPTION OF THE PREFERRED EMBODIMENT(S)

Figure 1:
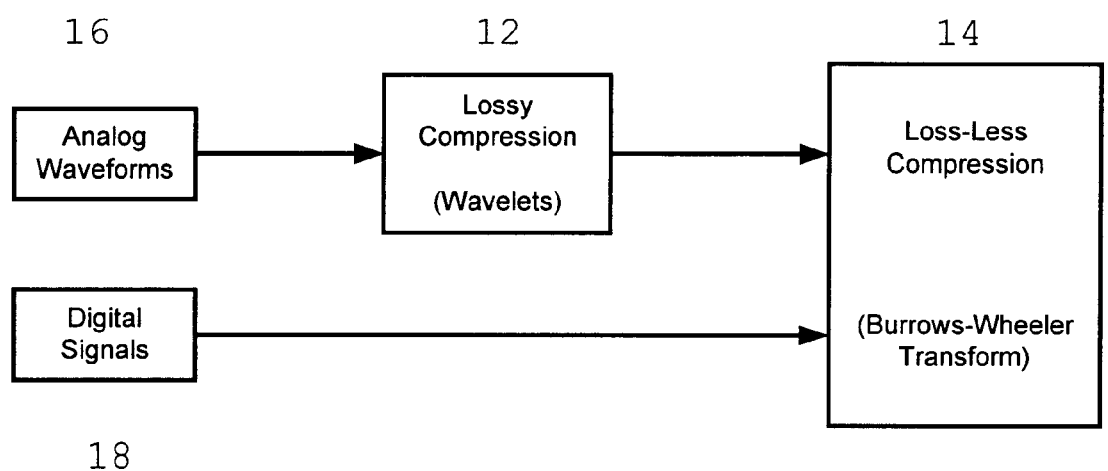
FIG. 1 shows a block diagram of the compression system of the present invention.

The present invention is described below in connection with the exchange of differential current and voltage data between two pilot protective relays. In this example the two relays exchange information about the three electrical current channels and the three voltage channels at the rate of four samples per quarter cycle per channel. Thus the two relays exchange a total of 24 data samples in each quarter cycle.

The current and voltage data samples exchanged between the two relays are the dynamic transient changes or differences in the current and voltage. The present invention allows the transmission of these samples in a manner such that all required information is promptly made available to both relays without compromising the integrity of the dynamic transient data. The present invention makes use of data compression and improves information throughput independent of the transmission technique.

As is well known data compression is divided into two main categories: Lossy and Lossless.

Loseless data compression includes techniques such as:
1) Statistical methods that minimizes quantization error according to likelihood of each sample. Most likely samples have lower error and better bit representation.
2) Prediction by Partial Mapping Algorithms (PPM). PPM is a statistical algorithm that uses Markov Chains.
3) Huffman coding that assigns shorter bit sequences to the most frequent sample or symbol.
4) Adaptive Huffman coding.
5) Dictionary-Based Codes.
6) Arithmetic Coding.
7) Fibonacci Coding.
8) Shannon-Fano Coding Scheme.
9) First Elias Code and Second Elias Code
10) Lempel-Ziv Codes (LZ77, LZ78, LZW, GZIP, LZSS, GIF, etc).
11) Run-Length Encoding (best fitting for slowly varying images).
12) Facsimile Encoding (transmits number of Zero's or One's).
13) Quadtree Compression.
14) Space-Filling Curves.
15) Delta Encoding. (Delta-modulation systems).
16) Burrows-Wheeler Algorithm.

Lossy data compression includes techniques such as:
1) Linear Predictive Coding (LPC) which is very useful in audio.
2) Block Truncation Coding.
3) Scalar Quantization.
4) Dynamic-Window based RLE.
5) Vector Quantization.
6) Differential Encoding (DPCM).
7) Transform Coding (Fourier, Wavelets, Cosine, Mellin, etc.).
8) Introduction to Color Spaces.
9) JPEG.
10) MPEG.
11) Fractal Coding.

Referring now to FIG. 1, there is shown a block diagram of the compression system 10 of the present invention. System 10 includes lossy compression 12 of the digital signal that represents the analog waveforms 16 (the analog to digital converter is not shown in FIG. 1) on a channel by channel basis using a lossy compression technique. In order to meet the requirement of having a trip decision made in a time which is less than the time for one cycle of the power line frequency, the lossy compression technique is preferably wavelets. System 10 further includes loss-less compression 14 of both digital signals 18, which are the status information, and the output of lossy compression 12 using a loss-less compression technique. In the embodiment described herein the loss-less compression technique is preferably the Burrows-Wheeler Transform which compresses the stacked output of lossy compression 12. It should be appreciated that the status information, which is typically a single bit or at most a small number of bits, is not subjected to lossy compression as such compression would compromise the integrity of the status information.

Signal decomposition in a multi-resolution framework using wavelets is the preferred lossy algorithm at the waveform level. It is desirable to decompose a power system waveform into multi-detail components and a coarse component with downsampling along the way. Waveform compression using wavelets is preferred because of the transient components exhibited in the signal.

A Fourier based or a Cosine Transform based scheme would be appropriate for a cyclical type waveform such as a power system signal. However, because relay-to-relay communication is most needed to transmit dynamic transient features, a wavelet or a fractal-based scheme is most appropriate. Those of ordinary skill in the art will appreciate that when processing time is taken into consideration wavelet-based compression is the preferred technique. Finally, it is at this stage where most of the compression is expected to take place. Therefore a delicate, efficient, but yet reliable scheme is essential, so that both relays have adequate information about the line transient characteristics and about each other.

Wavelet based signal compression is based on the notion that a transient waveform can be constructed from several detail signals and a coarse approximation. Compression occurs when portions of the detail components that are below a preset threshold can be ignored and set to zero. Upon decomposition, a signal is passed through two filters, a highpass filter and a lowpass filter. These filters have impulse responses that are directly related to the adopted wavelet. There are over sixty known wavelets and many others can be constructed according to some smoothness conditions.

After filtering, each signal is downsampled by a factor of two (dyadic wavelet decomposition). The highpass filtered signal is designated as the detail signal, and the lowpass filtered signal is designated as the coarse approximation. The lowpass filtered signal can be filtered again and downsampled further into a second detail signal and a coarser approximation and so on. This process of filtering the coarse approximation and downsampling further into a further detail signal and a further coarser approximation can continue until either the compression no longer yields helpful results or there is not any more data to process. When the process is over, the number of wavelet coefficients, or simply the number of samples in the combined detail signals and the coarse approximation equals that of the original signal.

The complexity of the whole decomposition process requires an Order of N multiplications, that is, O(N) computation, where N is the length of the original signal, that is, the raw data. Although both the original signal and the decomposed signal have the same length, the obtained multi-resolution signal is a better fit for compression than the raw data. Compression is accomplished by setting many of the detail components to zero. This setting of many of the detail components to zero has to be done carefully so that all fault relevant dynamic information is not disturbed by the approximation.

A compromise between keeping the important details, maintaining the signal energy, and achieving a high compression ratio must be found. Wavelet compression in this sense is equivalent to setting portions of the spectrum (or the Fast Fourier Transform) of the power system signal to zero as for example by using highpass filtering. Wavelets allow this compromise between keeping the important details, maintaining signal energy and achieving a high compression ratio to happen in a more selective manner.

As was described above, wavelet-based analysis is the preferred technique for compression of the relay to relay communications because of the transient nature of the fault signal added to the basic sinusoidal components of a power system signal. Wavelet based analysis is further preferred because of the implementation time constraints, and assuming a certain degree of nonstationarity in the fault signal. Results, described below in connection with FIGS. 2–25, of an investigation using real current power system data have shown that a Daubechies-4 wavelet is suitable for power system data compression.

Finally, a compression-based approach such as that using the preferred Daubechies-4 wavelet technique is better than removing samples from the original data, that is, downsampling the original data. Removing samples from the original data is simply a crude filtering of the power signal and compromises the data.

As is known by those skilled in the art downsampling or upsampling data is not to be performed arbitrarily but according to a process that requires proper use of interpolation and decimation Finite Impulse Response filters as dictated by the COMTRADE standard. Processing time is therefore needed for adjusting the sampling rate according to the IEEE standard or for compression purposes.

In contrast a wavelet based compression is a selective filtering approach that removes only those components that are least needed in the relay-to-relay communication process. Thus the wavelet based compression does not need the processing time needed to adjust the sampling rate.

As was described above, the preferred technique for loss-less compression 14 is the Burrows-Wheeler Transform (BWT). The BWT is a block sorting loss-less data compression algorithm. While there are other loss-less algorithms, such as the well known Lempel-Ziv algorithm, the BWT is very well suited for embedded system implementation even though it is not the most efficient loss-less technique from a performance standpoint.

The BWT does not operate in a streaming mode, but is applied to a block of data at once. As is well known to those skilled in the art larger blocks of data lead to more efficient compression.

Burrows and Wheeler recommend further compression using a Move to Front encoder followed by an entropy encoder such as Huffman Coding.

Wavelet based compression of a power system signal was investigated using the Daubechies-4 wavelet and real current power system data provided by the assignee of the present invention. The findings of the investigation are described below.

The data used in the investigation consisted of 728 binary data files of six channels each representing the real data sequence of the data that is exchanged between pilot protective relays prior to transformation into the frequency domain. The particular relays associated with this investigation exchange only 16 samples per cycle for each of the six channels (three electrical current and three electrical voltage), or 4 samples per channel per quarter cycle. Thus there are 12 samples exchanged per quarter cycle for the electrical current channels and 12 samples also exchanged per quarter cycle for the electrical voltage channels for a total of 24 samples exchanged for each quarter cycle. This amount of data cannot be transmitted with current 9600 baud wireline systems.

The purpose of the investigation was to determine if the pilot protective relays can transmit six channels sampled at the rate of four samples per quarter cycle using the same bandwidth currently used in pilot protective relays that use a wireline modem communications scheme. The goal of the investigation was to compress the 24 samples exchanged during each quarter cycle using a compression factor over 2:1.

During the investigation 12 different approaches, described below, were attempted. The investigation found that it is better to stack the data using four samples from channel 1 followed by four samples from channel 2 followed by four samples from channel 3 etc. (format A) rather than stacking one sample from channel 1 followed by one sample from channel 2 followed by a sample from channel 3 and so on (format B).

FIGS. 2–25 represent two cases. A rarely occurring worst case scenario with distinctly different strength channels and a more normal case with channels of consistent strength. Over 60 wavelets were tested during the investigation in an attempt to improve the performance of those compression schemes that use wavelets. There are 80 data files out of 728 which resemble the worst case scenario example.

The 12 approaches attempted during the investigation are described below in connection with FIGS. 2–25. The operational group delay is quarter cycle. The compression factor is posted in the top middle of each of the figures. A compression factor of two and above is needed.

In order to most clearly show the results of this investigation it is necessary to use different colors for the original and decompressed waveforms shown in FIGS. 2–25. Blue is the original waveform (decimated by a factor of 30). Red is the decompressed waveform.

Approach 1: Data compressed in time and stacked using four samples from channel 1 followed by four samples from channel 2, etc (format A). See FIGS. 2 and 3.

Approach 2: Data compressed in time and stacked using sample from channel 1, followed by a sample from channel 2, and so on (format B). See FIGS. 4 and 5.

Approach 3: Data compressed in the frequency domain using format A. The real and imaginary parts are compressed separately. See FIGS. 6 and 7.

Approach 4: Data compressed in the frequency domain using format A. The real and imaginary parts are stacked and compressed together. See FIGS. 8 and 9.

Approach 5: Data compressed in the frequency domain using format A. The magnitude and phase are compressed separately. See FIGS. 10 and 11.

Approach 6: Data compressed in the frequency domain using format B. The real and imaginary parts are compressed separately. See FIGS. 12 and 13.

Approach 7: Data compressed in the frequency domain using format B. The real and imaginary parts are stacked and compressed together. See FIGS. 14 and 15.

Approach 8: Data compressed in the frequency domain using format B. The magnitude and phase are compressed separately. See FIGS. 16 and 17.

Approach 9: Data is stacked using format A. The data is decimated in frequency and then converted back to time. See FIGS. 18 and 19.

Approach 10: Data is stacked using format B. The data is decimated in frequency and then converted back to time. See FIGS. 20 and 21.

Approach 11: Data is stacked using format A. Filtered in frequency and converted back to time. See FIGS. 22 and 23.

Approach 12: Data is stacked using format B. Filtered in frequency and converted back to time. See FIGS. 24 and 25.

The results of the investigation can be summarized as follows:

1. The best performance is shown in FIGS. 2 and 3 using wavelets in the time domain and in FIGS. 22 and 23 using filtering.
2. Wavelet compression in the frequency domain is undesirable. Particularly when compressing the amplitude and phase of the discrete Fourier Transform (DFT). The compression factor is very low and the results show distortion.
3. Decimation in frequency, i.e. reducing frequency resolution, (see FIGS. 18–21) is not an attractive approach.
4. Stacking format A is preferable to stacking format B.
5. Mixing one or two strong channels and 4 or 5 other weak channels produces significant distortion. About 80 files out of 728 exhibited this phenomenon at different levels.
6. Compression via wavelets in time gave the best results with a compression factor average of about 3. Compression via simple filtering and zero-padding gave the next best results with a constant compression factor of 2. All the other approaches gave either inferior compression factors or highly distorted results.

While the present invention has been described in connection with a 9600 baud wireline system it should be appreciated that the invention improves information throughput independent of the transmission technique.

It should also be appreciated that the present invention will result in an improvement of transmission time from one end of a protection zone to the other end of the zone and vice versa even if as is described herein the waveform information is lossy compressed and the combined lossy compressed waveform information and status information is not subjected to lossy compression as described herein.

It should be further appreciated that while the present invention has been described herein for transferring waveform information from a protective relay at one end of a protection zone to a protective relay at the other end of the zone and vice versa in a time which is less than the time for one cycle of the power line frequency the present invention may also be used to transfer information in addition to waveform information such as, for example, historical data that is not transmission time constrained and thus can be transferred from one end of the zone to the other end of the zone and vice versa in a time which is shorter than, equal to or longer than the time for one cycle of the power line frequency.

The present invention pertains to achieving increased performance by exchanging the required amount of signal and status information within a prescribed time period. Thus the present invention is not limited to any specific performance improvement, data rate, or communications medium.

Although as is described above a 56K bits per second fiber optic link without compression may as of the filing date of this application be able to deliver acceptable performance future performance improvements will require compression to communicate the additional information required without increasing the communications data rate above 56 k-bits per second. As the demand for performance improvements continue, this leap frog cycle of higher bandwidth, then compression, then even higher bandwidth, then compression, etc., will continue.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. In an electrical transmission system having at least one pilot protective relay at a first location and at least one pilot protective relay at a second location separated from said first location, a method for transmitting waveform information from said first location to said second location and from said second location to said first location, said method comprising:

a) compressing said waveform information at said first and said second locations using a lossy compression technique; and
    b) compressing said lossy compressed waveform information at said first and second locations using a loss-less compression technique.

2. The method of claim 1 wherein said lossy compression technique is wavelet compression.

3. The method of claim 2 wherein said wavelet compression technique use the Daubechies-4 type wavelet.

4. The method of claim 1 wherein said loss-less compression technique is the Burrows-Wheeler Transform.

5. The method of claim 1 wherein said lossy compression technique is wavelet compression and said loss-less compression technique is the Burrows-Wheeler transform.

6. The method of claim 1 wherein status information is also transmitted from said first location to said second location and from said second location to said first location further comprising compressing said status information using said loss-less compression technique.

7. The method of claim 1 further comprising transmitting said lossy and loss-less compressed waveform information from said first location to said second location and from said second location to said first location.

8. The method of claim 7 where said power transmission system has a predetermined power line frequency and the time for transmitting said lossy and loss-less compressed waveform information from said first location to said second location and from said second location to said first location is less than the time for one cycle of said power line frequency.

9. The method of claim 7 where said power transmission system has a predetermined power line frequency and the time for transmitting said lossy and loss-less compressed waveform information from said first location to said second location and from said second location to said first location is equal to or greater than said time for one cycle of said power line frequency.

10. The method of claim 6 further comprising transmitting of transmitting said lossy and loss-less compressed waveform information and said loss-less compressed status information from said first location to said second location and from said second location to said first location.

11. The method of claim 10 where said power transmission system has a predetermined power line frequency and the time for transmitting said lossy and loss-less compressed waveform information and said loss-less compressed status information from said first location to said second location and from said second location to said first location is less than the time for one cycle of said power line frequency.

12. The method of claim 10 where said power transmission system has a predetermined power line frequency and the time for transmitting said lossy and loss-less compressed waveform information and said loss-less compressed status information from said first location to said second location and from said second location to said first location is equal to or greater than said time for one cycle of said power line frequency.

13. In an electrical transmission system having at least one pilot protective relay at a first location and at least one pilot protective relay at a second location separated from said first location, each of said at least one pilot protective relays having waveform information associated therewith, a method comprising:

a) compressing said associated waveform information at said at least one pilot protective relay at said first location and at said at least one pilot protective relay at said second location; and b) transmitting said compressed associated waveform information from said at least one pilot protective relay at said first location to said at least one pilot protective relay at said second location and from said at least one pilot protective relay at said second location to said at least one pilot protective relay at said first location.

14. The method of claim 13 wherein said compressing step comprises:

(i) compressing said associated waveform information using a lossy compression technique; and (ii) compressing said lossy compressed associated waveform information using a loss-less compression technique.

15. The method of claim 14 wherein said lossy compression technique is wavelet compression.

16. The method of claim 14 wherein said loss-less compression technique is the Burrows-Wheeler Transform.

17. The method of claim 15 wherein said wavelet compression technique use the Daubechies-4 type wavelet.

18. The method of claim 14 where each of said pilot protective relays have status information associated therewith and said method comprises compressing said status information associated with said pilot protective relay at said first location with said loss-less compression technique and compressing said status information associated with said pilot protective relay at said second location with said loss-less compression technique.

19. An electrical transmission system comprising:

(a) a pilot protective relay at a first location on said system;

(b) a pilot protective relay at a second location on said system;

said pilot protective relay at said first location transmitting waveform information from said first location to said second location and said pilot protective relay at said second location transmitting waveform information from said second location to said first location;

(c) means for lossy compressing said waveform information at said first and second location; and (d) means for loss-less compressing said lossy compressed waveform information at said first and second locations.

20. The electrical transmission system of claim 19 where said means for lossy compressing said waveform information at said first and second locations uses wavelet compression.

21. The electrical transmission system of claim 19 where said means for loss-less compression of said lossy compressed waveform information at said first and second locations uses the Burrow-Wheeler Transform.

22. The electrical transmission system of claim 19 where said pilot protective relay at said first location transmits status information from said first location to said second location and said pilot protective relay at said second location transmits status information from said second location to said first location and said means for loss-less compressing said lossy compressed waveform information at said first and second locations also compresses said status information at said first and second locations.

23. The electrical transmission system of claim 19 where said system has a predetermined power line frequency and the time for transmitting said lossy and loss-less compressed waveform information from said first location to said second location and said second location to said first location is less than the time for one cycle of the said power line frequency.

24. The electrical transmission system of claim 19 where said system has a predetermined power line frequency and the time for transmitting said lossy and loss-less compressed waveform information from said first location to said second location and said second location to said first location is equal to or greater than the time for one cycle of said power line frequency.

* * * * *